United States Patent [19]

Hotta et al.

[11] 4,426,546

[45] Jan. 17, 1984

[54] FUNCTIONAL ELECTRIC DEVICES

[75] Inventors: Shu Hotta, Hirakata; Tomiharu Hosaka, Yawata; Wataru Shimotsuma, Ibaraki; Yoshio Kishimoto, Hirakata, all of Japan

[73] Assignee: Matsushita Electric Industrial Company, Limited, Osaka, Japan

[21] Appl. No.: 329,879

[22] Filed: Dec. 11, 1981

[30] Foreign Application Priority Data

Dec. 12, 1980 [JP] Japan ................ 55-176327

[51] Int. Cl.³ .............. H01L 31/04; H01C 7/00
[52] U.S. Cl. ..................... 136/256; 136/263; 338/22 R; 338/22 SD; 340/590; 357/65
[58] Field of Search .......... 136/256, 260, 263, 265; 357/8, 30, 65, 67; 338/22 R, 22 SD; 340/590; 252/500

[56] References Cited

U.S. PATENT DOCUMENTS 3,971,672 7/1976 Lampkin ................ 136/246
3,990,914 11/1976 Weinstein et al. ........ 136/746
4,120,705 10/1978 Shirland ................ 148/174

FOREIGN PATENT DOCUMENTS 49-21837 6/1974 Japan ................ 29/572

Primary Examiner—Aaron Weisstuch
Attorney, Agent, or Firm—Lowe, King, Price & Becker

[57] ABSTRACT

A functional electric device is described, which device comprises a functional material layer, and a pair of electrodes separated from each other and electrically contacting with the functional material layer. At least one of the pair of electrodes is made of copper or an alloy of copper and a copper inactivating agent is present between the functional material layer and the at least one of the paired electrodes. The functional electric device includes heat-sensitive, fusing and photovoltaic elements.

25 Claims, 2 Drawing Figures

FUNCTIONAL ELECTRIC DEVICES

BACKGROUND OF THE INVENTION

1. Field of the Invention

This invention relates to electric devices and more particularly to functional electric devices such as heat-sensitive, fusing, photovaltaic and the like devices.

2. Description of the Prior Art

In general, functional electric devices are fundamentally comprised of a functional material layer and at least a pair of electrodes which contact with the functional material layer and are spaced from each other. Upon application of AC or DC voltage to the layer through the electric conductors, it is possible to accurately detect a resistance, electrostatic capacitance or impedance which depends on the volume resistitivity or dielectric constant inherent to the material used, or a variation in these electrical characteristics. By the term "functional material" used herein is meant a material whose electrical characteristic such as resistance, electrostatic capacitance or impedance or its variation can be measured and utilized for some intended purposes. A variety of these functional materials are known, including materials such as ceramics, polymeric materials, organic materials such as organic semiconductors, dyes, etc., and the like. Among them, polymeric functional materials have now been widely used in the field of sensors for detecting environmental variations. For instance, there are known piezoelectric elements using polyfluorovinylidene compositions, heat-sensitive elements making use of polyamide compositions or compositions obtined by dispersing organic semiconductors in polyolefin resins such as polyethylene or polypropylene.

These elements are constructed, for example, such that one electrically conductive wire is spirally wound about a core and is then convered on the outer surface thereof with a functional polymer layer, which is in turn spirally wound with another elecrtrical conductive wire and the entirety is enclosed in an insulating cover to give a coaxial wire which is flexible as a whole. Alternatively, the element may have such a construction that a sheet-like functional polymer layer is formed and attached with electrical conductive wires on opposite surfaces thereof, and is accommodated in an insulating enclosure to give a multilayer plate. Of these, the coaxial wire has wide utility as a heatsensitive element of heating apparatus such as electric blankets.

In these functional electric elements, it is common to use copper or its alloys as a material for the electrically conductive wire or electrode. This is because copper has good conductivity and is excellent in workability. In this connection, however, copper is apt to undergo corrosion or other deterioration upon contact with an environmental atmosphere or functional material layer. Especially when copper wire undergoes such a change as mentioned above at portions in contacting a functional material, electrical characteristics such as impedance or other properties of the functional material cannot be accurately detected. When polymeric or organic functional materials which contain plasticizers, stabilizers, ionic substances or other impurities are used, copper is readily attacked by these substances and at the same time the layer of the polymer or organic material is adversely influenced or even decomposed by the attacked copper. These phenomena have considerably limited the application for copper or copper alloys as electrodes in functional electric elements. In addition, the phenomena become more pronounced when functional electric elements are employed under high temperature or high humidity conditions. This is because under these conditions, electrical contact between the functional material layer and the copper or copper alloy electrodes is impeded, making it almost impossible to accurately detect an electrical characteristic such as resistance, electrostatic capacitance or impedance or other changes in the functional material layer. In addition, since the functional polymer layer itself is attacked by copper and undergoes a change in quality, the above defect becomes more pronounced.

SUMMARY OF THE INVENTION

It is an object of the present invention to provide a functional electric device which overcomes the above-described drawbacks of the prior art.

It is another object of the invention to provide a functional electric device which comprises an organic functional material layer and electrodes of copper or its alloys but whose electrical characteristics such as resistance, electrostatic capactance, impedance, or a variation in these characteristics can reliably be detected in repeated use over a long time.

It is a further object of the invention to provide a functional electric device ensuring good contact between the functional material layer and the electrodes of copper or its alloy.

The above objects are achieved, according to the invention, by a functional electric device which comprises an organic functional material layer, a pair of electrodes which are separated from each other and are formed on the functional material layer, at least one of the pair of electrodes being made of copper or its alloys, a copper inactivating agent being present between the functional material layer and the at least one electrode. That is, the present invention is characterized by the presence of a copper inactivating agent between the organic functional material layer and at least one electrode made of copper or its alloy. This can be realized by a variety of methods. For instance, a copper inactivating agent may be directly applied either to the electrode of copper or copper alloy or to the functional material layer, or may be provided in the form of a layer between the electrode and the layer. Alternatively, the agent may be indirectly applied by incorporating it in the functional material layer. or in a covering material if the functional element or device has a cover. In the latter case, a sublimable copper inactivating agent gradually releases from the functional material layer or insulating cover and deposits on copper or copper alloy electrodes, resulting in its presence between the functional material layer and the electrodes.

The copper inactivating agent prevents the copper or copper alloy electrodes from corroding or deteriorating in quality, and thus good electrical connection between the functional material layer and the electrodes or, in some cases, between electrodes themselves is ensured. It is well known that such copper inactivating agents as used in the present invention can be applied to electrical contacts to prevention contact failure. However, such inactivating agents have never been applied to functional electric devices so as to prevent electrodes of copper or its alloys from corroding or changing in quality and to ensure good electrical contact of the device, enabling the functional material layer to perform satisfactorily.

DETAILED DESCRIPTION AND EMBODIMENTS OF THE INVENTION

Figure 1:
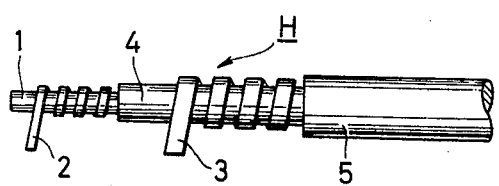
FIG. 1 is a schematic view of a heat-sensitive element of a coaxial construction for illustrating the invention.

As described hereinbefore, the copper inactivating agent should be present between a functional material layer and electrodes of copper or copper alloys. The manner in which the agent is caused to be present is closely related to the shape of the functional material layer or the arrangement of the device. When the functional material layer is used in the form of a thin film, sheet or disc, satisfactory results can be obtained by applying a layer a layer of a dispersion or solution of copper inactivating agent to the functional material and then forming a copper electrode on the applied layer by a suitable technique such as vacuum evaporation, sputtering or the like. Alternatively, when the functional material is in the form of a thick film or sheet, or a block or mass, it is sufficient to incorporate the copper inactivating agent in the thick sheet or block. Still alternatively, the agent may be incorporated in a core or cover if the device has such a core or cover.

The copper inactivating agents useful in the present invention include imidazole, thiazole, triazole and derivatives thereof. Among them, the derivatives of these compounds are preferable and include, for example, 2-mercaptobenzimidazole, 2-mercaptobenzothiazole, 3-(N-salicyloyl)amino-1,2,4-triazole, 4-(N-salicyloyl)amino-1,2,4-triazole, 5-(N-salicyloyl)-aminol, 2,3-triazole, and a 1,10-bis[(N-salicyloyl)amino]alkanediamide of the general formula

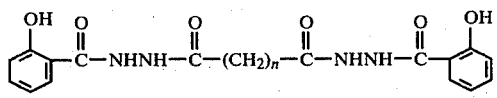

in which n is an integer of from 2 to 18. When incorporated in the functional material layer, the agent may be applied by ddisolving it in suitable liquid medium, and applying the solution to the electrode or functional layer in any suitable manner. Exampes of such a liquid medium include water soluble, alcohols such as methanol and ethanol, acetone and the like.

In accordance with the present invention, at least one of electrodes of the functional electric device should be made of copper or its alloy. Useful copper alloys for this purpose are, for example, Cu-Ag alloy, Cu-Ni alloy, Cu-Cr alloy and the like. In an ordinary case, copper or its alloys are used for both electrodes, and only in a specific type of functional electric element such as a photovoltaic cell, a metal other than copper, such as aluminum or silver, may be used as one electrode.

In practice, any material which is ordinarily employed in functional electric devices may be useable as the functional electric layer. For instance, ceramics, and organic materials such as polymers, organic semiconductors, dyes or pigments are usable. Of these, organic materials are particularly useful for the purpose of the invention.

The functional electric devices which make use of polymers or other organic materials as the functional material layer will be described in detail. That is, heat-sensitive and fusing elements using polymeric functional materials and photovaltaic cells using an organic functional or photosensitive material are described below.

1. Heat-sensitive Elements

Functional electric elements using polymers whose impedance changes in response to variations in temperature are widely employed as heat-sensitive elements. Especially, when a heat-sensitive element is arranged to have the form of a flexible coaxial wire, it has wide utility in the field of temperature detection for heating apparatus such as electric blanket, electric carpets and the like. Various materials are known as suitable for a heat-sensitive layer and include, for example, semiconductive materials such as quaternary ammonium salts, metal salts of 7,7,8,8-tetracyanoquinodimethane (hereinafter abbreviated as TCNQ) and the like. These materials show ion or electron conductivity and its variation is utilized for temperature detection. Further, materials whose dielectric constant varies greatly depending on the temperature may be likewise used. Examples of such materials include $BatiO_3$, $SiC$, and the like. As a matter of course these materials may be dispersed or incorporated in a polymer. In additiion, a specific type of polymer, such as polyamide, which whose dielectric constant varies greatly in response to temperature may be used. If a polymer itself is used, it may contain ordinarily employed ingredients such as stabilizers fillers and the like.

Especially, when a polyamide resin or composition is used as the heat-sensitive layer, it is preferred to incorporate a copper inactivating agent in the resin or composition since the agent serves to stabilize the impedance of polyamide under an electric field having a DC component. This means that the function of the heat-sensitive element is enhanced. For instance, when a polymer composition containing ionic material is used as a heat-sensitive layer, DC polarization takes place, so that it becomes almost impossible to apply to such a heat-sensitive layer a voltage having a DC component such as DC voltage or half-wave rectified AC voltage. With the heat-sensitive layer made of a polyamide resin or composition containing a copper inactivating agent, a voltage having a DC component can be applied to the layer without troubles.

As will be particularly described in Examples appearing hereinafter, when a polyamide resin or composition which does not contain the copper inactivating agent is used as heat-sensitive layr, the heat resistance of the layer at the time when a DC electric field is being applied is lowered much more than the heat resistance of the layer measured under conditions where no current is applied. Thus, a variation of impedance is caused not only by a change in temperature, but also by the presence of a DC electric field. However, when a copper inactivating agent according to the present invention is present in a heat-sensitive layer made of polyamide resin or composition, the impedance of the layer which might otherwise vary due to the influence of both heat and an electric field can be held almost constant.

Likewise, a polyvinyl chloride resin or composition can be used for the purposes of the invention. Polyvinyl chloride is inexpensive and excellent in workability and involves no difficulty in incorporating various types of ingredients therein. However, it has a drawback that under severe conditions of high temperature or high humidity, copper or copper alloy electrodes contacting polyvinyl chloride resin or compositions are strongly attacked by various ingredients therein or hydrochloric acid released from the polyvinyl chloride. Accordingly, when a polyvinyl chloride composition is used, it has been necessary to select an electrode material other than copper or copper alloys. This can be overcome by incorporating a copper inactivating agent in the polyvinyl chloride resin or composition.

In the above cases, a copper inactivating agent is incorporated into the layer which directly contacts the electrodes of copper or copper alloy. However, the present invention is not limited to these cases only. The copper inactivating agents indicated hereinbefore are sublimable under reduced pressure or by thermal diffusion, so that even when they are present in portions of the functional layer which do not directly contact the electrrodes, the electrodes can be formed with ther inactivating agent deposited on the surface thereof by sublimation.

The heat-sensitive elements according to the invention are particularly described in the following examples. The heat-sensitive element tested in Examples was a flexible coaxial wire type as shown in FIG. 1. In the figure, a heat-sensitive element H of the coaxial wire type includes a core 1, and an inner copper electrode 2 spirally wound about the core 1. The electrode 2 is covered with a heat-sensitive layer 4, which is in turn spirally wound with an outer copper electrode 3 as shown to form a heat-sensitive unit. The heat-sensitive unit is enclosed in an insulating cover 5. In this device, a DC or AC voltage can be applied between the electrodes 2 and 3 to detect the resistance, electrostatic capacitance or impedance of the heat-sensitive layer 4.

EXAMPLE 1

100 parts by weight of polyvinyl chloride, 50 parts by weight of pentaerythritol ester, 5 parts by weight of lead stearate, 5 parts by weight of N-methylpyridinium perchlorate, and 0.2 parts by weight of 2-mercaptobenzimidazole were mixed with one another. The mixture was subjected to an extruder to produce a gut-shaped molding and then pelletized. The resulting pellets were dried and subjected to a wire-making extruder. The resulting wire was covered with a polyvinyl chloride resin to obtain a heat-sensitive wire element.

EXAMPLE 2

70 parts by weight of polypropylene, and 15 parts by weight of a potassium salt of TCNQ and 15 parts by weight of graphite having specific resistances of $\times 10^6$ $\Omega$.cm and $3 \times 10^{-3}$ $\Omega$.cm, respectively, were mixed with one another. Then, the procedure of Example 1 was repeated to obtain a heat-sensitive wire unit. This unit was then covered with a polyvinyl chloride resin in which 0.5 parts by weight of 2-mercaptobenzothiazole per 100 parts by weight of the resin was incorporated.

EXAMPLE 3

100 parts by weight of polydodecaneamide and 1.0 parts by weight of 3-(N-salicyloyl)amino-1,2,4-triazole were mixed, followed by the procedure of Example 1, to obtain a heat-sensitive element.

COMPARATIVE EXAMPLES 1 THROUGH 3

Heat-sensitive elements were made in the same manner as in Examples 1 through 3 in which the 2-mercaptobenzimidazole, 2-mercaptobenzothiazole and 3-(N-salicyloyl)amino-1,2,4-triazole, respectively were omitted from the composition.

These heat-sensitive elements were allowed to stand in a hot air dryer at 120° C. for 500 hours. The impedance of each one meter long heat-sensitive element was measured before and after the heat treatments, with the results shown in Table 1. The thermistor B constant was calculated from measured impedance values at 30° C. and 60° C. The heat resistance is expressed by the ratio of the impedance values after heat treating at 120° C. to the impedance value before the heat treatment.

TABLE 1

| | | Impedance at 30° C. ($\times 10^6$ $\Omega$) | | Thermistor B Constant ($\times 10^3$ °K.) | | Heat Resistance |
|---|---|---|---|---|---|---|
| | | before heat treatment | after heat treatment | before heat treatment | after heat treatment | |
| Example | 1 | 3.1 | 3.2 | 9.0 | 8.5 | 1.2 |
| | 2 | 1.2 | 1.2 | 4.2 | 4.1 | 1.3 |
| | 3 | 8.7 | 8.8 | 3.2 | 2.9 | 1.5 |
| Comparative Example | 1 | 3.8 | 5.1 | 8.5 | 6.0 | 2.7 |
| | 2 | 1.7 | 2.0 | 3.9 | 3.2 | 1.8 |
| | 3 | 8.3 | 9.2 | 2.1 | 1.6 | 2.2 |

Then, the heat-sensitive elements obtained in Examples 2 and 3 and Comparative Examples 2 and 3 were placed in a hot air dryer at 120° C. and a DC voltage of 100 V was applied to each element for a period of 500 hours. The impedance values of each element prior to and after the treatment were measured in the same manner as described before, with the results shown in Table 2. The heat-sensitive elements of Example 1 and Comparative Example 1 were not tested since they showed too great a DC polarization to be an ion carrier due to the perchlorate.

TABLE 2

| | | Impedance at 30° C. ($\times 10^6$ $\Omega$) | | Thermistor B Constant ($\times 10^3$ °K.) | | Heat Resistance |
|---|---|---|---|---|---|---|
| | | before treatment | after heat treatment | before heat treatment | after heat treatment | |
| Example | 2 | 1.2 | 1.4 | 4.2 | 3.9 | 1.5 |
| | 3 | 8.7 | 9.0 | 3.2 | 2.8 | 1.8 |
| Comparative Example | 2 | 1.7 | 2.3 | 3.9 | 3.1 | 2.6 |
| | 3 | 8.3 | 9.8 | 2.1 | 1.1 | 4.0 |

As will be apparent from Tables 1 and 2, the heat-sensitive elements of the present invention exhibit reduced variations in impedance and thermistor B constant, and are thus highly stable.

EXAMPLE 4

100 parts by weight of polyundecaneamide and each 0.5 parts by weight of 2-mercaptobenzimidazole, 2-mercaptobenzothiazole and 3-(N-salicyloyl)amino-1,2,4-triazole were mixed with each other to give three mixtures, followed by repeating the procedure of Example 1 to obtain three heat-sensitive elements.

For comparison, the above procedure was repeated using polyundecaneamide alone to obtain a heat-sensitive element.

These heat-sensitive elements were continuously applied with a DC voltage of 500 V in a hot air dryer at 120° C. and impedance values of each element were measured prior to and after the application of the voltage. The test results are shown in Table 3.

TABLE 3

| Copper Inactivating Agent | Impedance at 30° C. (× 10⁶ Ω) before treatment | Impedance at 30° C. (× 10⁶ Ω) after treatment | Thermistor B Constant (× 10³ °K.) before treatment | Thermistor B Constant (× 10³ °K.) after treatment | Heat Resistance |
|---|---|---|---|---|---|
| 2-mercaptobenzimidazole | 9.0 | 9.2 | 2.6 | 2.5 | 1.7 |
| 2-mercaptobenzothiazole | 9.2 | 9.4 | 2.8 | 2.6 | 1.9 |
| 3-(N—salicyloyl)-amino-1,2,4-triazole | 8.8 | 9.1 | 3.1 | 2.7 | 1.9 |
| Comparative Example | 8.1 | 9.9 | 2.2 | 1.2 | 3.8 |

As will be apparent from Table 3, when the polyundecaneamide compositions in which 2-mercaptobenzimidazole, 2-mercaptobenzothiazole and 3-(N-salicyloyl)amino-1,2,4-triazole are used as a heat-sensitive layer, the elements exhibit excellent heat resistance and high thermister B constant values. That is, they are excellent both in temperature detectability and in heat stability.

Upon comparing the results of Tables 1, 2 and 3, it will be appreciated that the heat-sensitive elements without the copper inactivating agent are much lower in heat stability when is applied than when no voltage is applied. In contrast, the heat-sensitive elements using 2-mercaptobenzimidazole, 2-mercaptobenzothiazole or 3-(N-salicyloyl)amino-1,2,4-triazole maintain good heat stability even when DC voltage is applied. This is believed due to the activating fact that the agents produce an excellent copper inactivating effect and serve to stabilize the impedance under the electric field of direct current.

EXAMPE 5

As heat-sensitive elements as shown in FIG. 1 were fabricated in which the cores were made of, respectively, polyethyleneterephthalate fibers containing each 0.2 phr of 3-(N-salicyloyl)amino-1,2,4-triazole, 4-(N-salicyloyl)amino-1,2,3-triazole, 5-(N-salicyloyl)amino-1,2,3-triazole and 1,10-bis[(N-salicyloyl)amino]-decanediamide of the formula

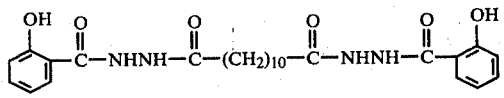

and the heat-sensitive layer was made of polydodecaneamide.

For comparative purposes, the above procedure was repeated using a core of polyethyleneterephthalate fibers alone.

These heat-sensitive elements were placed in a hot air dryer at 120° C. and continuously applied with a DC voltage of 100 V for 500 hours in order to measure impedance values prior to and after the application of voltage. The results are shown in Table 4.

As will be apparent from Table 4, the heat-sensitive elements of Example 5 exhibit reduced variations of impedance and have stable characteristics.

TABLE 4

| Copper Inactivating Agent | Impedance at 30° C. (× 10⁶ Ω) before treatment | Impedance at 30° C. (× 10⁶ Ω) after treatment | Thermistor B Constant (× 10³ °K.) before treatment | Thermistor B Constant (× 10³ °K.) after treatment | Heat Resistance |
|---|---|---|---|---|---|
| 3-(N—salicyloyl)-amino-1,2,4-triazole | 8.1 | 8.7 | 2.3 | 1.9 | 2.3 |
| 4-(N—salicyloyl)-amino-1,2,3-triazole | 8.3 | 8.7 | 2.3 | 2.0 | 2.2 |
| 5-(N—salicyloyl)-1,2,3-triazole | 8.0 | 8.5 | 2.2 | 1.9 | 2.2 |
| 1-10-bis[(N—salicyloyl)amino]-decaneamide | 7.9 | 8.4 | 2.4 | 2.1 | 2.0 |
| Comparative Example | 8.3 | 9.8 | 2.1 | 1.1 | 4.0 |

As will be understood from the results of Examples 1 through 5, the heat-sensitive elements of the invention have excellent electric characteristics. Needless to say, the present invention is applicable not only to the coaxial type heat-sensitive element but also to ordinary heat-sensitive elements which comprise a flat heat-sensitive layer and at least a pair of electrodes of copper or copper alloy which are spaced from each other or placed at opposite sides.

In general, the copper inactivating agent is incorporated in the heat-sensitive layer or core in an amount of 0.001 to 10 parts per hundred part of resin to achieve the purposes of the invention. Though polyundecaneamide and polydodecaneamide are used in the Examples, other polyamides such as polyhexamethylenesebacamide, polynonaneamide, and polytridecaneamide are similarly usable.

2. Fusing Element

Another type of known functional electric element using polymeric functional materials is a fusing element in which a functional polymer layer sandwiched between copper or copper alloy electrodes is fused on application of heat to cause the electrodes to contact with each other whereby too high a temperature can be detected. This element is employed to detect abnormal, local heating. In this case, the functional polymer layer should readily be fused without sluggishly softening and examples of materials for such a layer include polyamides such as polyundecaneamide, polydodecaneamide and the like, crystalline polymers, and particularly polyolefins such as polyethylene, polypropylene and the like. In order to accurately detect the contact between the electrodes upon fusing of the layer, the electrodes must be maintained in undeteriorated or uncorroded condition. This can be attained by causing the copper inactivating agent to be present between the polymer layer and the electrodes. This is particularly described by way of example.

EXAMPLE 6

100 parts by weight of polydodecaneamide was admixed with 0.5 parts by weight of 3-(N-salicyloyl)amino-1,2,4-triazole, followed by repeating the procedure of Example 1 to make a fusing element as shown in FIG. 1.

For comparison, the above procedure was repeated using polydodecaneamide alone. These elements were each placed in a hot air dryer and heated at a rate of 5° C. per minute to observe the temperature at which the fusion of the layer was detected. Twenty elements each of the Example and the Comparative Example were observed. The ranges of temperature at which the fusion was detected are shown in Table 5.

TABLE 5

|  | Temperature Range (°C.) |
| --- | --- |
| Example 6 | 185-190 |
| Comparative Example | 190-240 |

As will be apparent from Table 5, the fusion detection temperature of the fusing elements of the Example is very close to the melting point (180°-185° C.) of polydodecaneamine and the fusion can be detected within a much narrower range of temperature than in the case of the fusing elements of Comparative Example.

With the fusing element, it is sufficient to add the agent in an amount of 0.001 to 10 parts by weight per 100 parts by weight of resin used.

3. Photovoltaic Element

Figure 2:
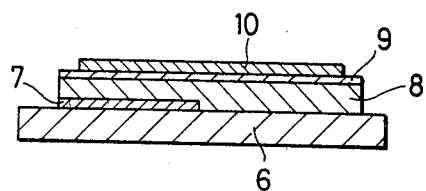
FIG. 2 is a schematic view of a photovoltaic element according to one embodiment of the invention.

A photovoltaic element which is comprised of a sheet or film of a merocyanine dye as organic functional material with aluminium electrode and silver electrodes provided on opposite sides of the sheet has been described, for example, in D. L. Morel et al., Appl. Phys. Lett. 32(8),495(1978). We have made a photovoltaic element of such a construction as shown in FIG. 2, which comprises a transparent substrate 6, such as of glass, an aluminum electrode 7, a photosensitive layer 8, a layer 9 of copper inactivating agent, and a copper electrode 10 arranged in this order. The aluminum electrode 7 does not entirely cover the inner surface of the dye layer, i.e. the dye layer partly directly contacts the glass substrate, as shown, through which the dye layer is exposed to light to generate electromotive force. When the photoelectric characteristic of this element was measured, it was found that the photovoltaic element in which a copper inactivating agent was present between the photosensitive layer and the copper electrode exhibited an excellent photoelectric characteristic over a long time. This is particularly described in the following example.

EXAMPLE 7

A semi-transparent aluminium electrode was formed on a glass substrate by vacuum deposition and then a merocyanine dye of the formula

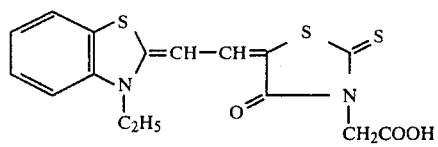

was formed on the aluminum electrode and also on the glass substrate as shown in FIG. 2 by spin coating a chloroform solution of the dye in a thickness of about 500 Å. After complete evaporation of the chloroform, benzothiazole was vacuum deposited on the dye layer, followed by formation of a semi-transparent copper electrode by vacuum evaporation, thereby making a photovoltaic element.

For comparison, the above procedure was repeated without depositing the benzothiazole layer.

These elements were each irradiated by sunlight of an intensity of 50 mW/cm$^2$ to determine the open circuit electromotive force Voc and short-circuit current Isc. The results are shown in Table 6.

TABLE 6

|  | Voc (V) | Isc (mA/cm$^2$) |
| --- | --- | --- |
| Example 7 | 1.8 | 3.2 |
| Comparative Example | 1.5 | 0.9 |

Furthermore, when the element of Example 7 was subjected to irradiation of sunlight for 10 hours, neither the open circuit electromotive force nor the short-circuit current thereof was lowered. From this, it will be understood that the photovoltaic element of the invention has excellent photoelectric conversion characteristics.

Aside from the merocyanine dye, photosensitive materials which are usually employed for this purpose can be likewise used and similar results are obtained. Examples of such photosensitive materials include salts of TCNQ, methalophthalocyanine, squavylium dyes and the like.

What is claimed is:

1. A functional electric device comprising a functional material layer, and a pair of electrodes which are separated from each other and electrically contact said functional material layer, at least one of said pair of electrodes being made of copper or an alloy of copper, a copper inactivating agent being present between said functional material layer and said at least one electrode.

2. The functional electric device according to claim 1, wherein said pair of electrodes is provided on opposite sides of said functional material layer.

3. The functional electric device according to claim 1, wherein said copper inactivating agent is present in said functional material layer.

4. The functional electric device according to claim 1, wherein said copper inactivating agent is in the form of a layer provided between said functional material layer and said at least one electrode.

5. The functional electric device according to claim 1, wherein said functional material layer is made of a polymer.

6. The functional electric device according to claim 5, wherein said polymer changes in impedance in response to a change in temperature.

7. The functional electric device according to any one of claims 1 through 6, wherein said functional material layer is made of a polyamide.

8. The functional electric device according to claim 7, wherein said polyamide is polyundecaneamide or polydodecaneamide.

9. The functional electric device according to any of claim 1 through 7, wherein said functional material layer is made of polyvinyl chloride.

10. The functional electric device according to claim 1, wherein said functional material layer is made of an organic semiconductive material whose impedance changes due to a change in ion conductivity, electron conductivity or dielectric constant thereof.

11. The functional electric device according to claim 1, wherein said functional material layer is in the form of a tube, and said pair of electrodes are formed on the inner and outer surfaces of said tube.

12. The functional electric device according to claim 11, wherein the copper inactivating agent is incorporated in said functional material layer.

13. The functional electric device according to claim 11, further comprising an insulating cover enclosing the electrode-bearing tube therein.

14. The functional electric device according to claim 11, wherein said functional material layer is made of a polyamide or polyvinyl chloride, the impedance of which changes in response to a change in temperature, whereby said device can be used as a heat-sensitive element.

15. The functional electric device according to claim 11, wherein said functional layer is made of a polyamide or a crystalline polymer which melts at a certain level of temperature upon application of heat thereto, whereby the pair of electrodes contact with each other and said functional electric device serves as a fusing element.

16. The functional electric device according to claim 14 or 15, wherein said polyamide is polyundecaneamide or polydodecaneamide.

17. The functional electric device according to claim 15, wherein said crystalline polymer is a polyolefin.

18. The functional electric device according to claim 1, further comprising an optically transparent substrate on which one of said pair of electrodes, said functional material layer made of a thin film of a photosensitive material capable of developing an electromotive force when exposed to light, and another electrode made of copper or an alloy of copper are formed in this order, said copper inactivating agent being present between said functional material layer and said other electrode as a layer.

19. The functional electric device according to claim 18, wherein said functional material layer is partially directly formed on said transparent substrate, through which light is passed.

20. The functional electric device according to claims 1, 13 or 18, wherein said copper inactivating agent is imidazole, thiazole, triazole, their derivatives or a mixture thereof.

21. The functional electric device according to claim 20, wherein the imidazole derivative is 2-mercaptobenzimidazole.

22. The functional electric device according to claim 20, wherein the thiazole derivative is 2-mercaptobenzothiazole.

23. The functional electric device according to claim 20, wherein the triazole derivative is 3-(N-salicyloyl)amino-1,2,4-triazole, 4-(N-salicyloyl)amino-1,2,3-triazole, 5-(N-salicyloyl)aminol,2,3-triazole, a 1,10-bis[(N-salicyloyl)amino]alkanediamide having 2 to 18 methylene groups, and 1,2,3-benzotriazole.

24. A functional electric device comprising a functional material layer, a pair of electrodes which are separated from each other and electrically contact said functional material layer, at least one of said pair of electrodes being made of copper or an alloy of copper, and an insulating cover enclosing said functional material layer and said pair of electrodes therein, said insulating cover containing a sublimable copper inactivating agent, whereby said copper inactivating agent sublimes so as to be present between said functional material layer and said at least one electrode.

25. A functional electric device comprising a functional material layer in the form of a tube, a pair of electrodes which are separated from each other and electrically contact said functional material layer on the inner and outer surfaces of said tube, at least one of said pair of electrodes being made of copper or an alloy of copper, and a core supporting the inner electrode, said core containing a sublimable copper inactivating agent therein which sublimes so as to be present between said functional material layer and said at least one electrode.

* * * * *